US011867769B2

(12) United States Patent
Tong

(10) Patent No.: US 11,867,769 B2
(45) Date of Patent: Jan. 9, 2024

(54) ENERGY STORAGE SYSTEM

(71) Applicant: The Regents of the University of California, Oakland, CA (US)

(72) Inventor: Shijie Tong, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 144 days.

(21) Appl. No.: 17/432,084

(22) PCT Filed: Feb. 20, 2020

(86) PCT No.: PCT/US2020/019092
§ 371 (c)(1),
(2) Date: Aug. 18, 2021

(87) PCT Pub. No.: WO2020/172449
PCT Pub. Date: Aug. 27, 2020

(65) Prior Publication Data
US 2022/0196753 A1    Jun. 23, 2022

Related U.S. Application Data

(60) Provisional application No. 62/808,173, filed on Feb. 20, 2019.

(51) Int. Cl.
*G01R 31/392* (2019.01)
*H02J 7/00* (2006.01)
(52) U.S. Cl.
CPC .......... *G01R 31/392* (2019.01); *H02J 7/0069* (2020.01)

(58) Field of Classification Search
None
See application file for complete search history.

(56) References Cited

U.S. PATENT DOCUMENTS

| | | | |
|---|---|---|---|
| 4,829,225 A * | 5/1989 | Podrazhansky | H02J 7/00711 320/129 |
| 5,998,968 A | 12/1999 | Pittman et al. | |
| 7,038,426 B2 | 5/2006 | Hall | |
| 2002/0146617 A1 * | 10/2002 | Johnson | H01M 10/441 429/7 |

(Continued)

OTHER PUBLICATIONS

International Search Report and Written Opinion, dated May 14, 2020, International Patent Application PCT/US2020/019092 filed Feb. 20, 2020.

*Primary Examiner* — Jas A Sanghera
(74) *Attorney, Agent, or Firm* — Mintz Levin Cohn Ferris Glovsky and Popeo, P.C.

(57) ABSTRACT

A system, a method, and a computer program product for providing heterogeneous unifying battery storage. A state-of-health value of a battery is determined. The state-of-health value of the battery is less than an original capacity value of the battery. The battery is connected to an electrical power source for re-conditioning. A target state-of-health value for the battery and a number of cycles required to achieve the target state-of-health value of the battery are determined. Each cycle in the number of cycles includes at least one of: a charging the battery and a discharging the battery. The battery is re-conditioned by cycling the battery using the determined number of cycles. Cycling includes drawing electrical power from the electrical power source.

22 Claims, 14 Drawing Sheets

(56) References Cited

U.S. PATENT DOCUMENTS

2008/0079397 A1* 4/2008 Fee .................. H02J 7/0069
320/141
2014/0101476 A1 4/2014 Lu et al.
2015/0367747 A1* 12/2015 Decker ............... H02J 7/0069
320/136

* cited by examiner

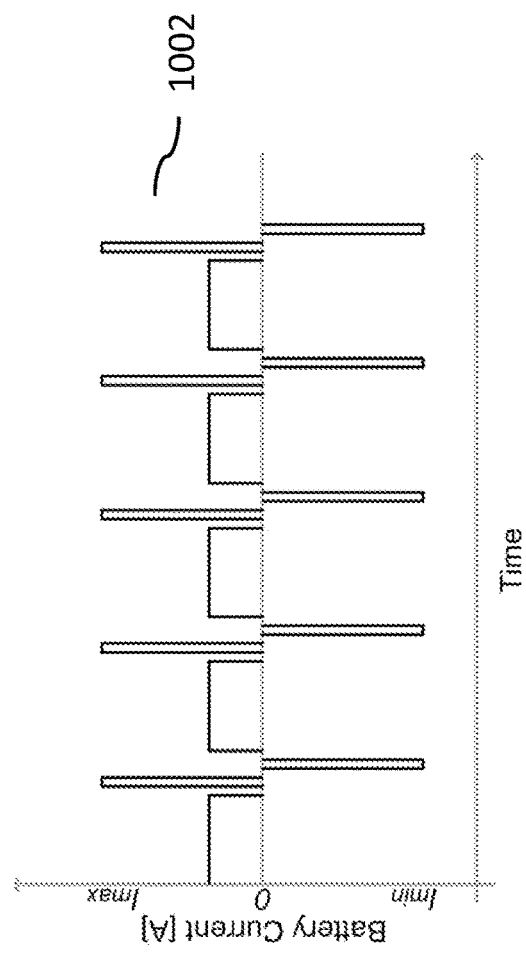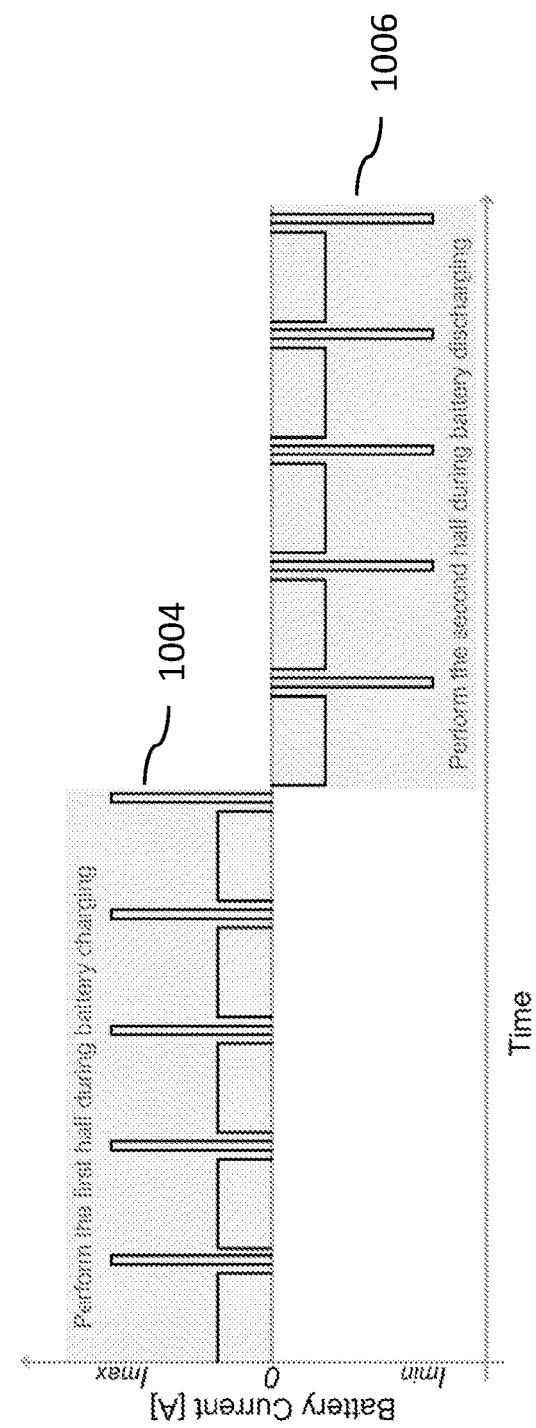

ENERGY STORAGE SYSTEM

CROSS-REFERENCE TO RELATED APPLICATIONS

The present application claims priority to and is a national stage entry of International Application No. PCT/US2020/019092 to Shijie Tong, filed on Feb. 20, 2020, and entitled "Energy Storage System," which claims priority to U.S. Provisional Patent Appl. No. 62/808,173 to Shijie Tong, filed on Feb. 20, 2019, and entitled "Low-Cost, Easy-to-Integrate, and Reliable Stationary Energy Storage System with Second Life," and incorporates their disclosures herein by reference in their entireties.

STATEMENT OF GOVERNMENT SPONSORED SUPPORT

This invention was made with government support under DE-AR0001045 awarded by the U.S. Department of Energy. The government has certain rights in the invention.

BACKGROUND

In the modern world, many manufacturing, production, and end-user devices and/or systems rely on a continuous supply of electrical power for an uninterrupted operation. Some devices (e.g., household appliances, lights, etc.) rely on being connected to an electrical grid for operation, whereas others (e.g., electric cars, smartphones, etc.) use rechargeable batteries that power up their circuits and components. These batteries periodically need to be recharged. Examples of rechargeable batteries include aluminum-ion batteries, lithium-ion batteries, nickel-cadmium batteries, etc. While recharging of batteries can be performed multiple times, at certain point, the rechargeable batteries' health begins to decline causing the batteries to fail or supply inadequate power (e.g., during a shorter period of time). Typically, batteries health begins to decline as soon as the batteries begin their first cycle. Usually, batteries that have reached 80% of their capacity are recycled and/or refurbished to allow for a continuous use known as "second life" or "second use".

Second life batteries (e.g., vehicular batteries) have a significantly lower cost compared to new batteries, and can potentially be used for stationary energy storage. However, reintegrating batteries from vehicular application to stationary application is a labor and cost intensive process. Degrading battery performances and mismatches in battery health also pose problems in connection with second life batteries performance, safety, and/or reliability.

SUMMARY

In some implementations, the current subject matter relates to a method for implementing a heterogeneous unifying battery storage system. The method may include determining a state-of-health value of a battery. The state-of-health value of the battery may be less than an original capacity value of the battery. The battery may be connected to an electrical power source for re-conditioning. The method may further include determining a target state-of-health value for the battery and a number of cycles required to achieve the target state-of-health value of the battery. Each cycle in the number of cycles may include at least one of: a charging the battery and a discharging the battery. The method may also include re-conditioning the battery by cycling the battery using the determined number of cycles. Cycling may include drawing electrical power from the electrical power source.

In some implementations, the current subject matter may include one or more of the following optional features. The battery includes at least one of the following: a battery cell, a battery unit, a battery system, a battery brick, a battery brick group, and any combination thereof.

In some implementations, the target state of health value for the battery may be determined using a battery aging model generated based on one or more prior re-conditionings of a plurality of batteries.

In some implementations, the re-conditioning may include determining a re-conditioned state of health value of a battery after performing the re-conditioning. Further, the method may include comparing the re-conditioned state of health value to the determined target state of health value of the battery, repeating the re-conditioning of the battery upon determining that the re-conditioned state of health value does not equal to the determined target state of health value of the battery, and disconnecting the battery from the electrical power source upon determining that the re-conditioned state of health value equals to the determined target state of health value of the battery. Additionally, the method may include connecting another battery to the electrical power source for re-conditioning after disconnecting the battery, and repeating the determining a state of health value, determining a target state of health value and a number of cycles, and the re-conditioning for the another battery.

In some implementations, a plurality of batteries may be connected to the electrical power source for re-conditioning, each battery in the plurality of batteries is individually connected to the power source using corresponding converter and a relay component. An amount of electrical power demand for the plurality of batteries may be determined based on an individual amount of power demanded by each battery in the plurality of batteries for at least one of the determining the state of health value for the battery, the re-conditioning of the battery, and any combination thereof.

Implementations of the current subject matter can include, but are not limited to, systems and methods consistent including one or more features are described as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to the rendering of objects using ultrasound, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 10a illustrates a plot of high-power pulse characterization test;

FIG. 10b illustrates an exemplary plot of a modified high-power pulse characterization test, according to some implementations of the current subject matter;

DETAILED DESCRIPTION

In some implementations, the current subject matter relates to a heterogeneous unifying battery (HUB) system that may be configured to enable a scalable approach for second use of retired electric vehicle batteries. The current subject matter system may be further configured to provide stationary and/or mobile energy storage services that may be configured to apply re-conditioning/re-cycling, and/or re-balancing routines to used batteries while the batteries are being used to provide power. Once a re-conditioned/re-cycled used battery module reaches a predetermined state of health (SOH) value and uniformity, it may be removed from the system and connected to a consumer device (e.g., a home appliance, a utility grid, etc.) for subsequent use. Hence, instead of commissioning a new energy storage system for long-term services, the current subject matter's system may be configured to integrate individual second life battery modules for a short period of time. The reusing-while-reconditioning of the used batteries can be configured to lower energy storage cost per kilowatt (kWh) per cycle.

Figure 1:
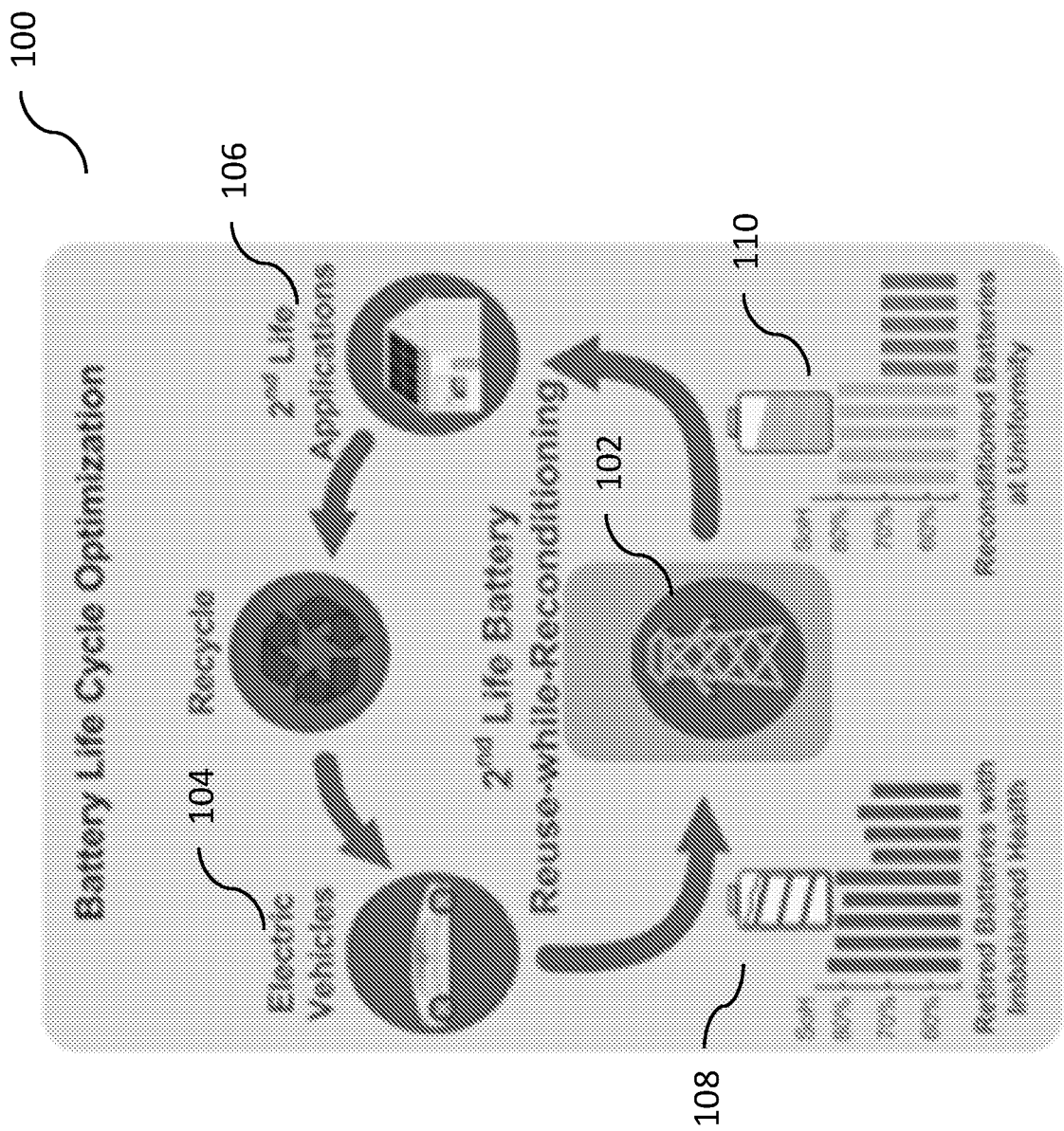
FIG. 1 illustrates an exemplary integration topology along with a typical battery (e.g., electrical vehicle battery) lifecycle, according to some implementations of the current subject matter.

In some implementations, the current subject matter system may include an integration topology 102, as for example is shown in FIG. 1. The topology 102 may be configured to connect one or more used battery modules 108 (e.g., that were used in electric vehicles 104) using a dock. The topology 102 may further include a distributed management system along with one or more independent power converter(s), which may be interconnected on a power output side, for performing re-conditioning and/or re-balancing the used battery modules 108 into reconditioned battery modules 110, while the battery modules are being used. Once reconditioned, the battery modules 110 may be used to power various second life applications 106. The current subject matter system may be configured to control every throughput of individual battery modules in order to produce usable capacity of battery modules and to uniformly improve cycle life while providing synchronized stationary storage services. In some exemplary implementations, the current subject matter system may be configured to connect battery modules (e.g., lithium batteries) having different chemical composition, form factors, health, aging status, etc.

In the following description, a "battery cell" may refer, by way of an example, to a smallest physical and/or functional element of a battery system in which electrical energy may be stored in the form of a chemical energy. A "battery unit" may refer, by way of an example, to a smallest controllable component within a battery system subject to use and/or form factor, ranging from a single battery cell to multiple battery cells connected in parallel and/or in series. A "battery system" may refer, by way of an example, to a system of battery cells and/or battery units that may be electrically connected in parallel and/or series and/or designed to operate as a single controllable energy storage resource. Battery modules and/or racks in stationary applications and/or battery packs in electric vehicles may be various examples of such battery systems. A "battery brick" may refer, by way of an example, to a smallest physical component of a battery system capable of being disassembled and/or accessed without significant disruption of physical elements, such as, welds and/or battery trays. For example, electrically, a battery brick may include multiple battery units that may be connected in series. "Brick groups" may refer, by way of an example, to multiple bricks that may be integrated together to achieve a desired output voltage in the HUB system.

A "cycle" may refer, by way of an example, to one complete battery charge and/or discharge cycle, defined as discharging an amount of energy equivalent to the battery's capacity limit. A "round trip efficiency (RTE)" may refer, by way of an example, to an efficiency of a battery that may be determined by a ratio of a total energy that may be required to fully charge the battery compared to a total discharged energy over a specified charge/discharge cycle. RTE may be determined by an internal resistance of the battery and may indicate an energy loss during charge and/or discharge cycling.

A "battery state of charge (SOC)" may refer to, by way of an example, to a battery's level of charge in relation to its total available capacity. The SOC may be represented as a percentage. For example, 100% SOC may mean that a battery is fully charged; conversely, 0% SOC may mean that a battery is depleted.

A "state of health (SOH)" may refer, by way of an example, to a battery's remaining capacity compared to a new battery. The SOH may also be represented as a percentage. For example, a new battery may have a SOH value close to 100%. Additionally, SOH may be affected by a measured internal resistance and/or impedance as a result of thermal and safety concerns.

A "secondary application" may refer, by way of an example, to a follow-on application, and/or purpose, for a battery system and/or battery component after that system and/or component was removed from its original, primary application and/or use.

Some existing grid energy storage systems connect a large numbers of battery components in parallel (i.e., sharing common voltage) and series (i.e., sharing common current) to obtain a desired voltage and power output. These various strings are then connected to a monolithic power control system (PCS) to interface with an electrical grid, a load, or a generator. Such systems require and enforce high standards of uniformity in battery state of health (SOH) among components to ensure overall system performance. As a result, these systems are conducive to and have been engineered for new battery cells to enable and maintain the required uniformity for sufficient periods of operation and use. However, as battery cells degrade over both cycle and calendar life, such systems are vulnerable to degradation due to non-uniform, biased battery degradation that can compromise overall system performance and reliability.

Figure 2:
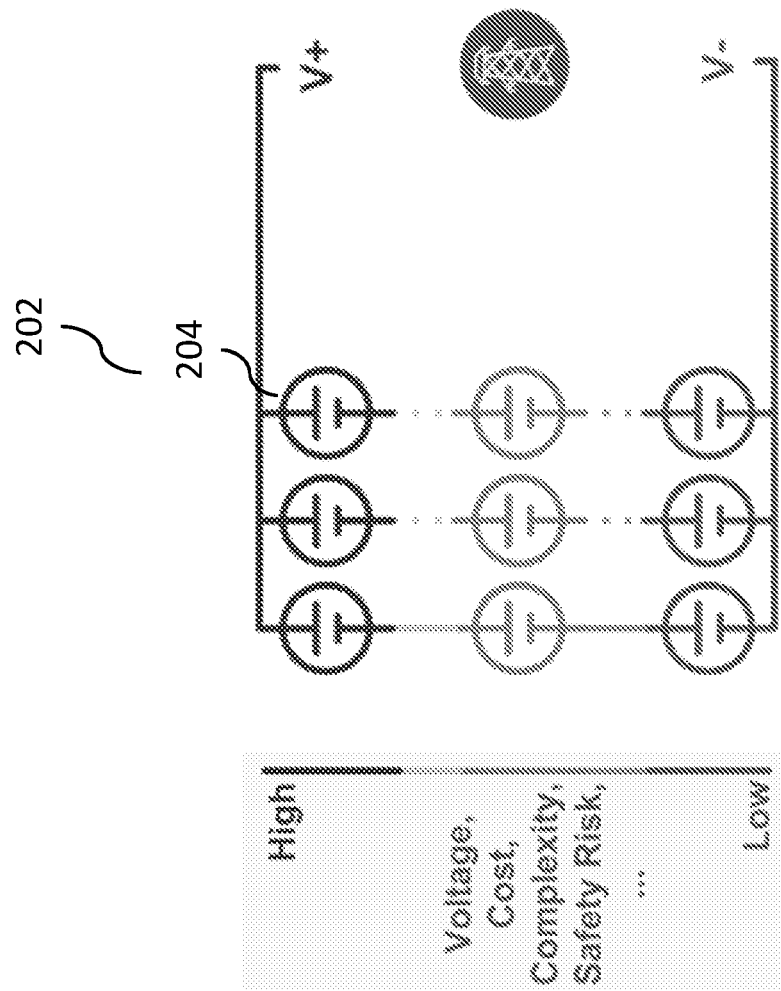
FIG. 2 illustrates an example of conventional battery integration topology.

FIG. 2 illustrates an example of such conventional battery integration topology 202. Topology 202 connects series-parallel configured battery packs 204 to a single-unit inverter to obtain a desired output power. In this topology, current flow among parallel connected cells is unbalanced and current between series-connected cells is common and penalizes weaker cells, all leading to mismatch in battery module health and compromising the overall system performance and safety in the long term.

Figure 3:
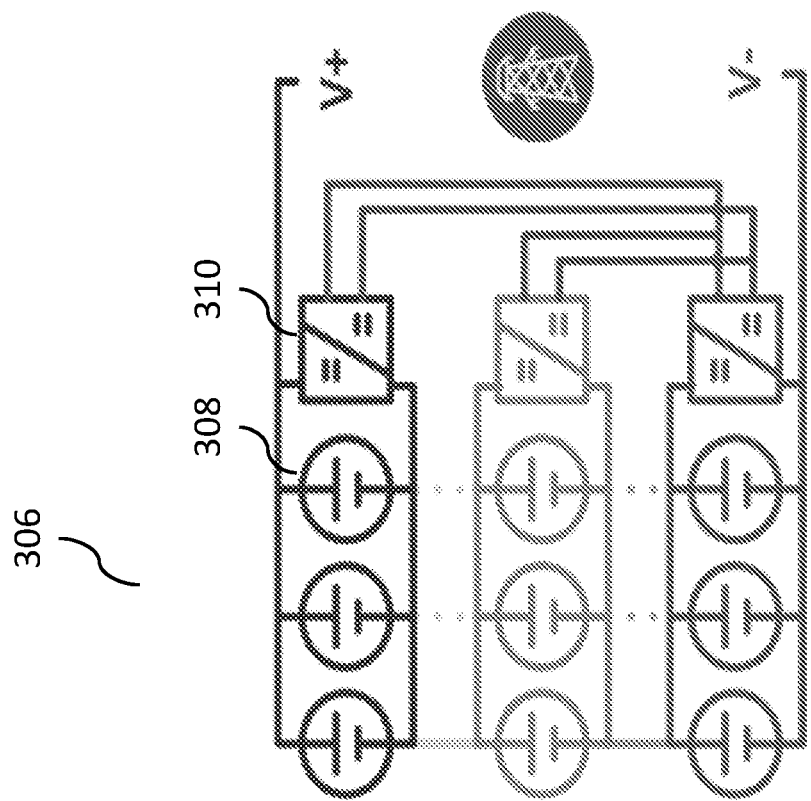
FIG. 3 illustrates another example of conventional battery integration topology

Other conventional battery integration topologies, e.g., topology 306 as shown in FIG. 3, may provide series parallel connection with balancing. The topology 306 is an integrated DC/DC topology connects groups of batteries 308 to an inverter 310, which are then interconnected with other groups of batteries and their respective inverter. While this topology enables battery balancing, it fails to improve battery second life, requires significant additional circuitry and high maintenance costs.

Figure 4C:
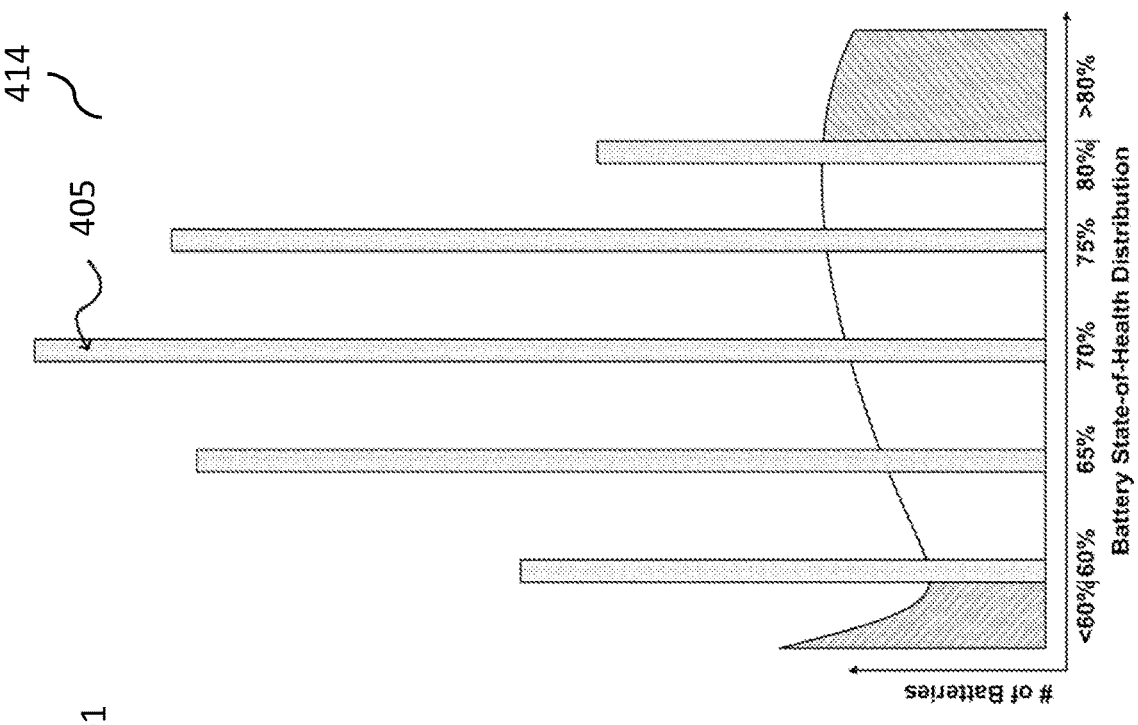
FIG. 4c illustrates an exemplary state of health (SOH) distribution of batteries after performing re-conditioning/re-cycling processes, according to some implementations of the current subject matter.
Figure 4A:
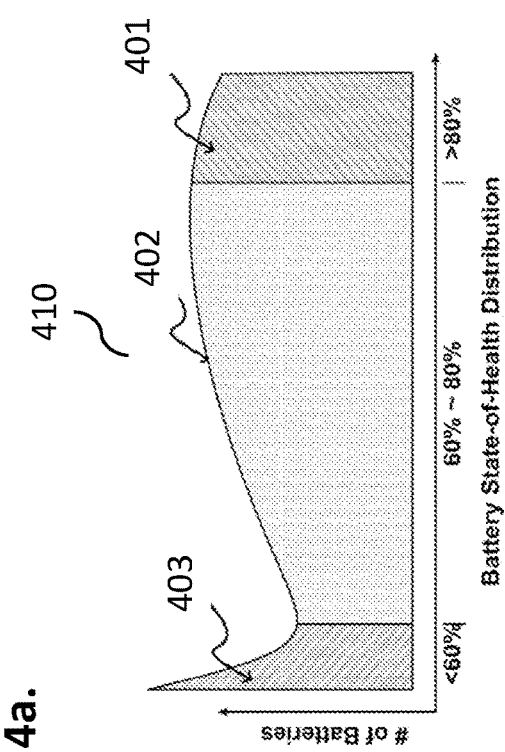
FIGS. 4a-b illustrate a state of health (SOH) distribution of battery bricks after non-uniform degradation in a primary application.

FIG. 4a illustrates a state of health (SOH) distribution 410 of battery bricks after non-uniform degradation in a primary application, for example, a mobile application. As shown in FIG. 4a, battery bricks 401 rated above 80% SOH are hypothetically suitable for return to the primary application. Battery bricks 402 rated between 60%-80% SOH are potentially suitable for secondary applications. Battery bricks 403 rated below 60% SOH are determined not suitable for primary or secondary applications, and would be directed to recycling and disposal. As can be understood, the above percentage ratings are provided for exemplary purposes only and are not intended to limit the scope of the subject matter of the present application. Other percentage ratings and/or ranges of percentage rating may be used to determine whether a particular battery is suitable/not suitable for primary and/or secondary applications, may need to be recycled, disposed, etc.

Figure 4B:
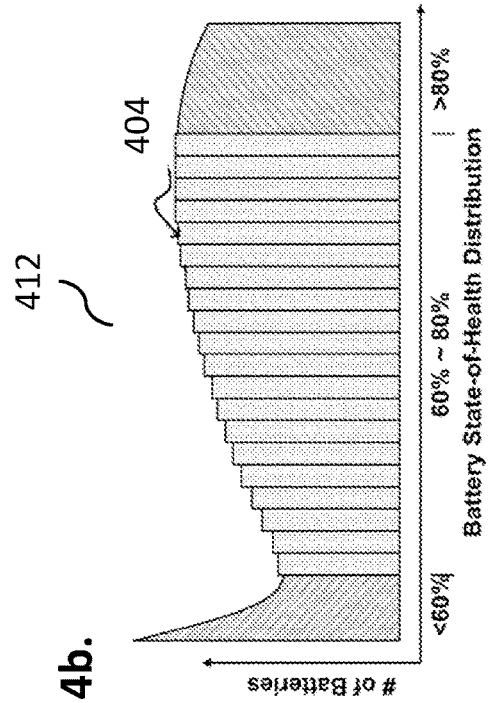

To assess battery bricks for potential secondary applications, conventional system perform a binning process. The binning process connects individual battery bricks to a battery tester to conduct a characterization test in order to quantify SOH and roundtrip efficiency. Based on the acquired battery SOH, groups of battery bricks with similar SOH are binned together in various systems for secondary applications. FIG. 4b illustrates a distribution 412 of binned bricks 404 subsequent to performing this process. However, the binning process has the following limitations: (1) repurposed batteries have SOH and potential long-term performance distributed over a wide spectrum, which presents significant challenges for reliability in secondary applications, and (2) binning allows quantification of SOH but does not enable optimization to a known set point.

To address the limitations of conventional systems, the current subject matter's heterogeneous unifying battery (HUB) system may be configured to re-condition/re-cycle used batteries to a predetermined state of health level (such as, for example, while the batteries may be configured to be used to provide power to various devices, systems, etc. that may be coupled to the HUB system). Once the batteries reach the predetermined state of health, they may be removed from the HUB system for use in secondary applications (e.g., connection to household appliances, building, electrical grids, etc.). The HUB system may be configured to include hardware, software and any combinations thereof that may be configured to provide control and cycling operations. FIG. 4c illustrates an exemplary distribution 414 of groups of batteries 405 that have been re-conditioned/re-cycled using the current subject matter processes.

Figure 5:
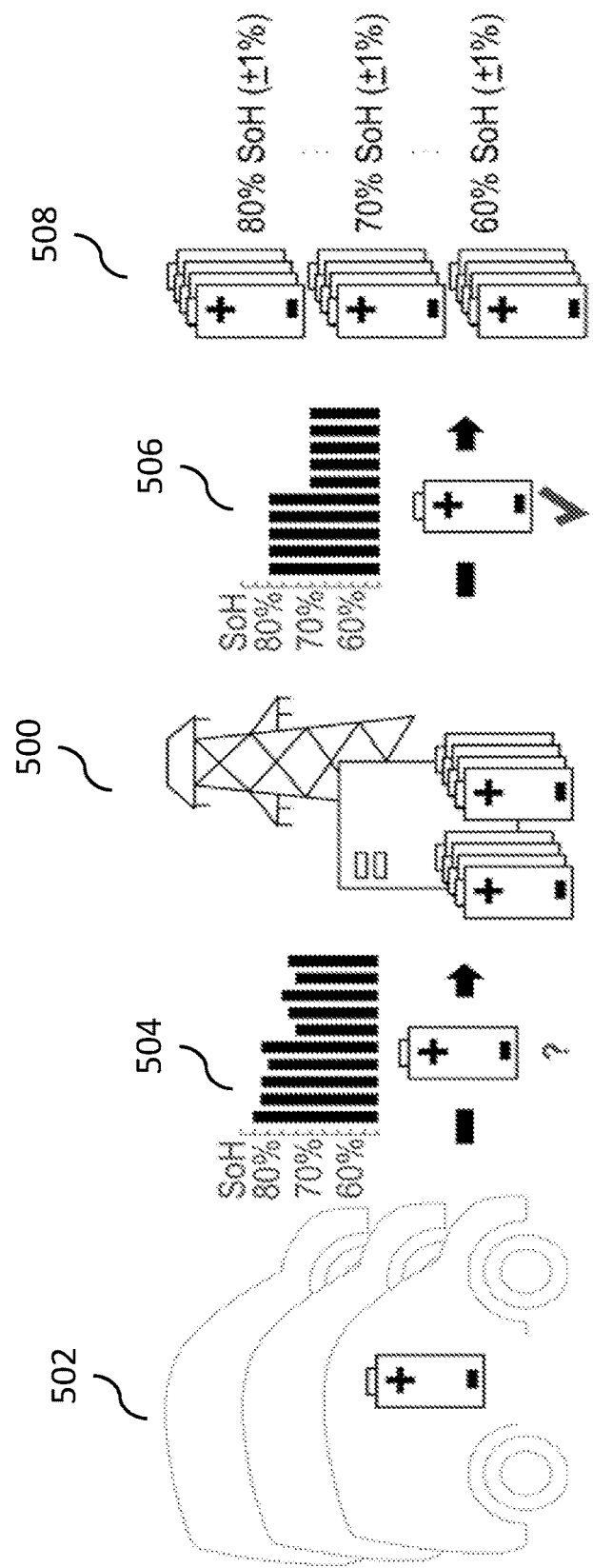
FIG. 5 illustrates an exemplary system heterogeneous unifying battery system, according to some implementations of the current subject matter.

FIG. 5 illustrates an exemplary system heterogeneous unifying battery system 500, according to some implementations of the current subject matter. The system 500 may be configured to receive one or more batteries (e.g., battery cells, units, bricks, groups, etc.) 504 from first use applications (e.g., new car batteries that may be include together with new vehicles, etc.). After completion of the first use applications, the batteries' capacities may become depleted. Hence, each of the batteries 504 that may be received by the system 500 may have varying state of health, e.g., between 60%-80% of their original capacity.

The HUB system may be configured to charge and constant-cycle the received batteries (e.g., battery cells, units, bricks, groups, etc.) 504. The system 500 may cycle each battery and manage state of health until a predetermined state of health value. The predetermined state of health value may be determined based on the specific second life applications 508. For example, if used batteries enter the system 500 with a distributed state of health between 60% to 80%, the system 500 may be configured to cycle and/or condition the batteries to produce re-conditioned/re-cycled batteries 506 that may have states of health of, for example, 60%, 65%, 70%, 75% or 80%, with a tolerance <1%. The system 500 may be configured to coordinate a matrix of interconnected converters (not shown in FIG. 5). The system 500 may be configured to unify battery state of health into a one or more subgroups to ensure reliable and consistent second life applications' batteries performance.

Figure 6:
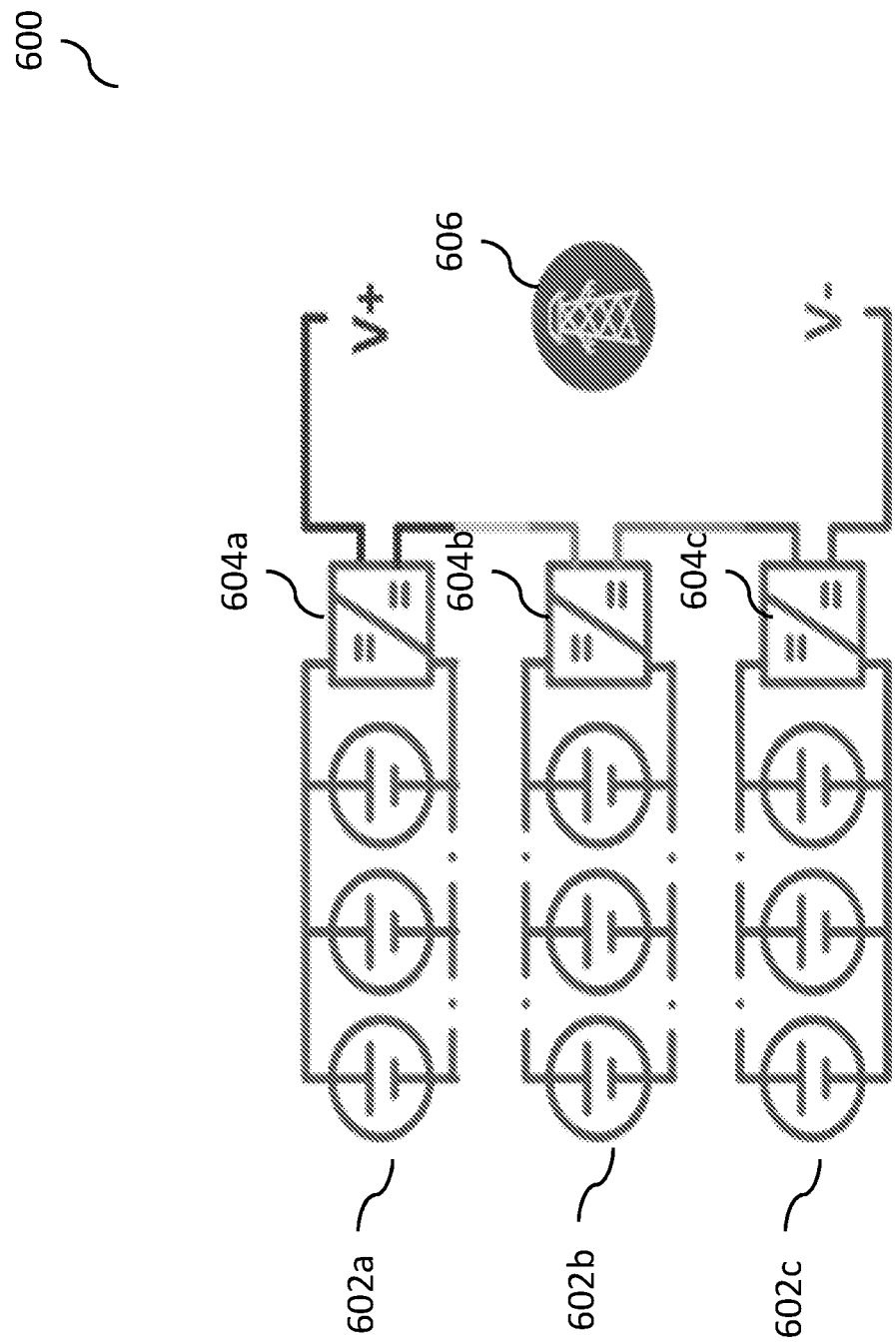
FIG. 6 illustrates an exemplary battery topology system that may be incorporated into the system shown in FIG. 5, according to some implementations of the current subject matter.

FIG. 6 illustrates an exemplary battery topology system 600 that may be incorporated into the system 500 shown in FIG. 5, according to some implementations of the current subject matter. The topology system 600 may be configured to include multiple batteries (e.g., battery cells, units, bricks, groups, etc.) 602a that may be coupled to an individual converter 604a (similarly, batteries 602b may be coupled to the converter 604b; and batteries 602c may be coupled to the converter 604c). The converters 604 may then be individually connected to the power source 606. The topology system 600 may allow easy removal and/or insertion of individual batteries 602 and/or groups of batteries 602. For example to remove a particular batteries 602a, the converter 604a may be disconnected from the chain of converters 604, without breaking connection of other converters 604b, 604c (which may continue re-conditioning/re-cycling of their corresponding batteries 602b, 602c, respectively). Once connection of batteries 602a to the power source 606 is ready to be made, the converter 604a may be coupled back into the chain of converters 604 and the power source 606.

As stated above, conventional systems typically connect one or more battery bricks in series to achieve a predetermined voltage output, whereby a single unit inverter is used to regulate charging and/or discharging power. Battery bricks within a series string of battery systems are, thus, subject to the same current during charging and/or discharging operations. As a result, if battery bricks have dispersed capacities, their accessible capacity is determined by the weakest bricks in a string. Moreover, because the battery current is determined by Kirchhoff's rule, battery bricks' state of health are uncontrollable.

To address these issues, the current subject matter system may be configured to re-condition/re-cycle batteries (e.g., battery cells, units, bricks, groups, etc.) with varying states of health by implementing a battery level interconnected converter matrix and controller driven relays. Each battery may be independently controlled by the converter to manage state of health. This may allow individual batteries (e.g., battery cells, units, bricks, groups, etc.) to be swapped by relay operation without suspending operation of the overall system. Further, the batteries total capacity may be accessed to improve system performance. As a result, the current subject matter system may accomplish battery integration and/or de-integration through an active and live swapping process.

Figure 7:
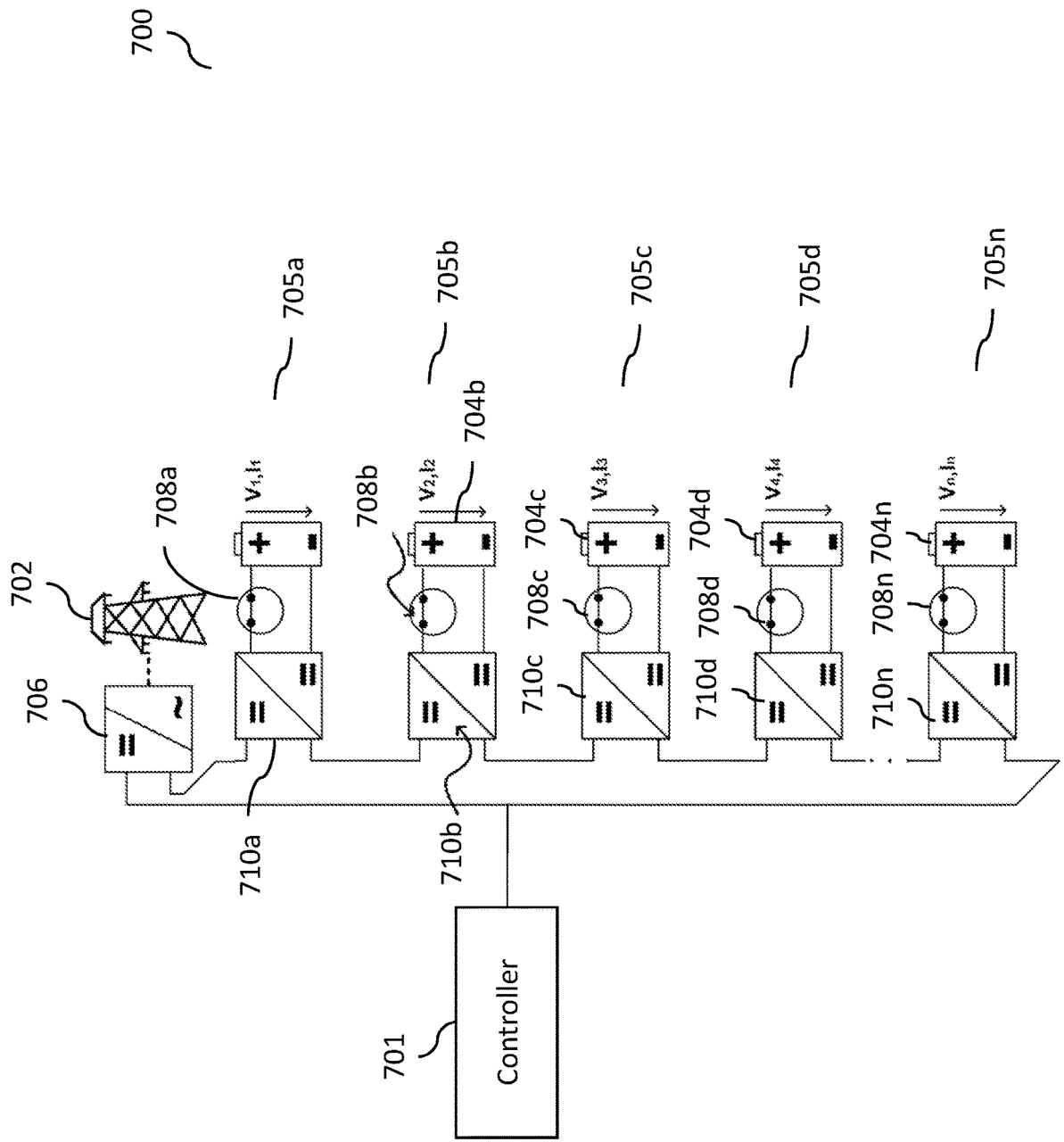
FIG. 7 illustrates an exemplary heterogeneous unifying battery system, according to some implementations of the current subject matter.

FIG. 7 illustrates an exemplary heterogeneous unifying battery system 700, according to some implementations of the current subject matter. The system 700 may include a controller 701, a power source or grid 702, and one or more battery branches 705 (a, b, c, d, . . . n). The battery branches 705 may include one or more batteries (e.g., battery cells, units, bricks, groups, etc.) 704 (a, b, c, d, . . . n), a grid interface inverter 706, one or more relay components 708 (a, b, c, d, . . . n), and one or more independent controlling converters 710 (a, b, c, d, . . . n). The controller 701 may be configured to control operations of the branches 705 as well as various aspects of the system 700, as discussed herein. The controller 701 may be any combination of hardware and/or software and may be communicatively coupled to one or more components of the system 700. The power grid 702 may be coupled to the grid interface inverter 706 that may be configured to provide an interface between the power grid 702 and the individual converters 710.

Each individual converter 710 may be configured to be coupled to the grid interface inverter 706 as well as to a respective relay component 708 (e.g., converter 710a may be configured to be coupled to the relay component 708a; converter 710b may be configured to be coupled to the relay component 708b; etc.). The batteries 704 may be coupled to the converters 710 via respective relay components 708 (e.g., battery 704a may be coupled to the converter 710a via the relay component 708a; battery 704b may be coupled to the converter 710b via the relay component 708b; etc.). The batteries 704 are not connected to each other (as in the conventional system (e.g., as shown in FIGS. 2-3)).

Use of the individual converters 710 may be configured to independently control its respective battery (e.g., battery cells, units, bricks, groups, etc.) 704 as well as manage its state of health. Moreover, the converters may allow easy swapping of individual batteries 704 without disconnecting the entire system (e.g., battery 704a may be disconnected from the topology system 700 by disconnecting the relay component 708a, while the remaining batteries 704 (b, c, d, . . . n) may remain connected. Further, using the relay components 708, the batteries' 704 total capacity may be also accessed to improve system performance. In particular, the currents $I_1, I_2, \ldots I_n$, that may be supplied to the corresponding batteries 704 may also be independently controlled by the respective individual converters 710. Voltages $V_1, V_2, \ldots V_n$ may be adaptable to the specific voltages of batteries 704.

In some implementations, the system 700 may be configured to include one or more computing systems and/or frameworks for performing control and/or management of various components of the system 700 (e.g., inverter 706, converters 710, relay components 708, and/or batteries 704), which may be wholly and/or partially incorporated into the controller 701. The computing systems/frameworks incorporated into the system 700 may be configured to process various data, such as, one or more batteries' (e.g., battery cells, units, bricks, groups, etc.) state of health data, input/output current data, input/output voltage data, predetermined desired end state of health data (e.g., battery capacity of 60%, 70%, etc.) for second life applications, batteries' usage data, batteries' cycle data, etc. The data may include data, metadata, structured content data, unstructured content data, embedded data, nested data, hard disk data, memory card data, cellular telephone memory data, smartphone memory data, main memory images and/or data, forensic containers, zip files, files, memory images, and/or any other data/information. The input and/or the output data may be in various formats, such as text, numerical, alpha-numerical, hierarchically arranged data, table data, email messages, text files, video, audio, graphics, etc. The data may be obtained via manual entry, collected automatically through one or more sensors, smartphones, electrical and/or electronics equipment, and/or any other devices and/or systems.

The system 700 may further one or more analysis engine(s), one or more computing platforms, one or more storage/database components, one or more servers, etc., which again may be partially and/or wholly incorporated and/or coupled to the controller 701. These components may be communicatively coupled using one or more communications networks. The communications networks may include at least one of the following: a wired network, a wireless network, a metropolitan area network ("MAN"), a local area network ("LAN"), a wide area network ("WAN"), a virtual local area network ("VLAN"), an internet, an extranet, an intranet, and/or any other type of network and/or any combination thereof.

Moreover, such computing components may include any combination of hardware and/or software. In some implementations, components may be disposed on one or more computing devices, such as, server(s), database(s), personal computer(s), laptop(s), cellular telephone(s), smartphone(s), tablet computer(s), and/or any other computing devices and/or any combination thereof. In some implementations, the components may be disposed on a single computing device and/or may be part of a single communications network. Alternatively, the components may be separately located from one another. Further, various application programming interfaces (APIs) and/or communication interfaces may be integrated into various components of the system 700 to allow interfacing between the controller 701, batteries 704, inverter 706 and converters 710, relay component 708, as well as supporting computing devices, systems, databases, etc., and/or any other components.

Figure 8A:
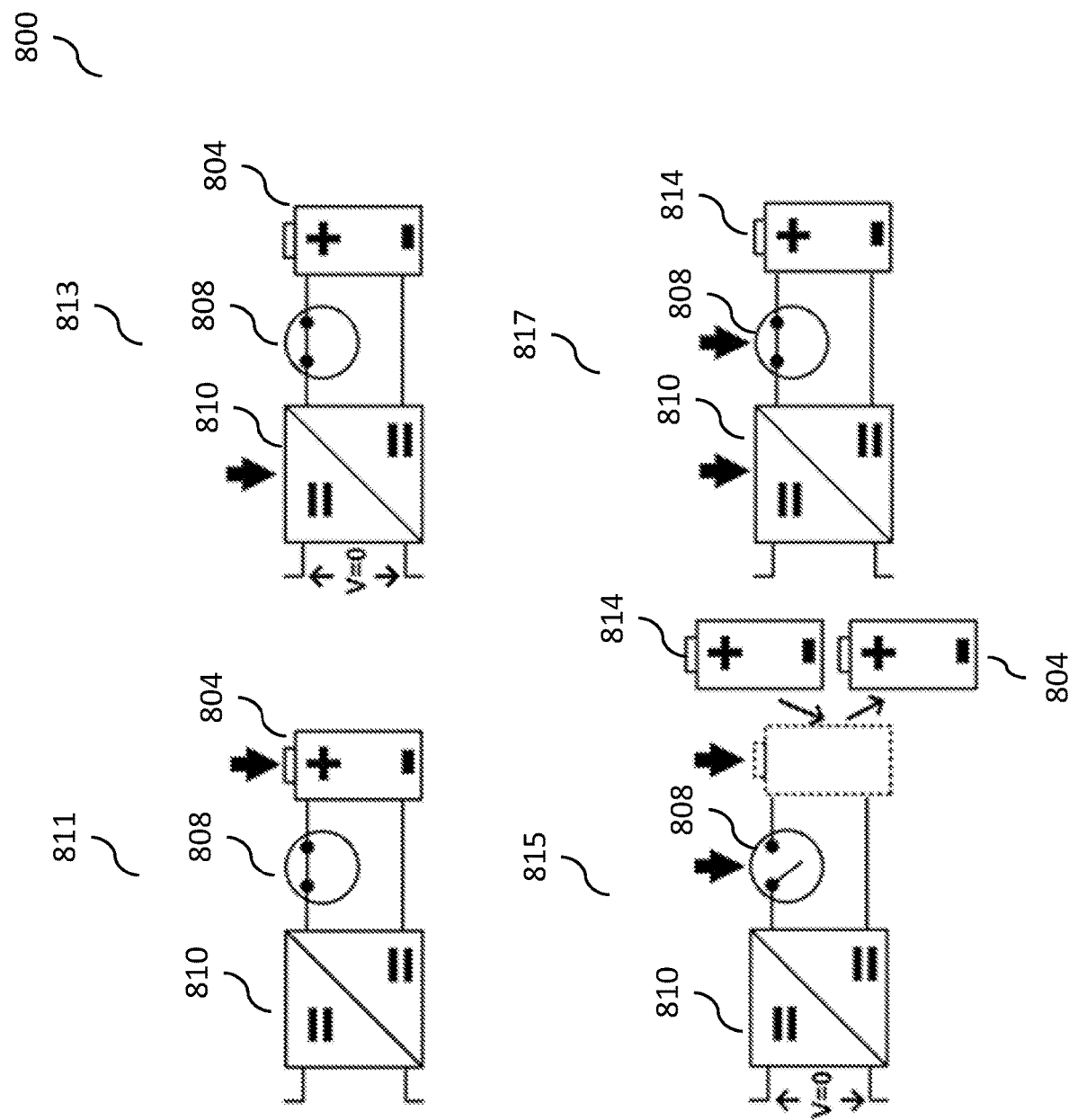
FIGS. 8a-8b illustrate an exemplary process for swapping of individual batteries (e.g., battery cells, units, bricks, groups, etc.), according to some implementations of the current subject matter.
Figure 8B:
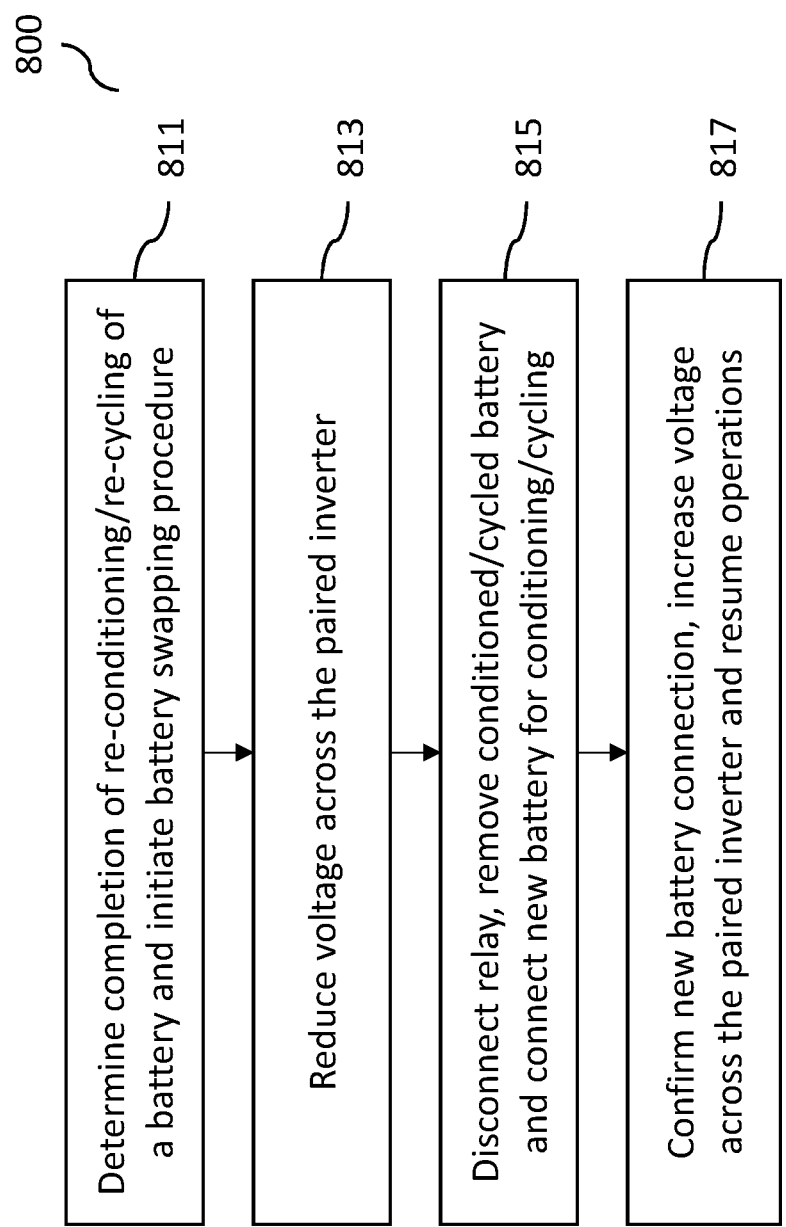

FIGS. 8a-8b illustrate a process 800 for swapping of individual batteries (e.g., battery cells, units, bricks, groups, etc.), according to some implementations of the current subject matter. FIG. 8a illustrates an exemplary block diagram corresponding to the process 800 and FIG. 8b illustrates an exemplary flow diagram, corresponding to the block diagram of FIG. 8a, of the process 800. The process 800 may be performed by the system 700 shown in FIG. 7, for example, when a battery brick completes re-conditioning.

At 811, the controller 701 of the system 700 may be configured determine whether re-conditioning/re-cycling of a particular battery (e.g., battery cell(s), unit(s), brick(s), group(s), etc.) 804 has been completed. The controller 701 may then initiate battery swapping procedure.

At 813, the controller 701 may be configured to cause a voltage on the input side of the converter 810, which is coupled to the battery 804 via a relay component 808, to be reduced to a minimum value (e.g., zero). The voltage across the converter 810 may be adaptable to the specific voltage of the battery. On the output side of the converter 810 (i.e., the side connected to the grid), the voltage may be changed to adjust the power with the current remaining the same. Similar to FIG. 7, the converter 810 may be configured to individually control re-conditioning/re-cycling of the battery 804. Reduction in voltage may be configured to electrically disconnect the battery 804 from the remainder of the system 700. To reduce the current across the converter 810, the controller 701 of the system 700 may be configured to generate an appropriate command and transmit it to the converter 810. Alternatively, or in addition to, a switch and/or another relay component may be switched off to cause the voltage across the converter 810 to drop.

By dropping the current across the converter 810, the controller 701 may be configured to also disconnect the relay component 808, which may allow for removal of the battery 804, at 815, and replacing it with another battery (e.g., battery cell(s), unit(s), brick(s), group(s), etc.) 814 that may need to be re-conditioned/re-cycled. In some implementations, the new battery 814 may be connected using any known method. For example, the new battery 814 may be connected manually by an operator and/or automatically, such as, by the controller 701 generating a command to connect battery 814. In some exemplary implementations, one or more batteries that may be waiting to be re-conditioned/re-cycled may be allocated for connection to a particular converter 810 and once one of the batteries is determined to be re-conditioned/re-cycled to a particular desired state of health level (e.g., 60%, 70%, etc. of the original capacity), the controller 701 may generate a command to connect the next-in-line battery to the relay component 808 for re-conditioning/re-cycling.

Once the controller 701 determines that the battery 814 has been connected to the relay component 808, the controller 801 may close the relay component 808 and increase current across the converter 810 for re-conditioning/re-cycling of the battery 814, at 817. In some exemplary implementations, battery swapping process may be performed independently for each individual battery. Once batteries are connected in the system 700, they may be configured to undergo re-conditioning/re-cycling process until a desired level of the state of health is reached.

Figure 9A:
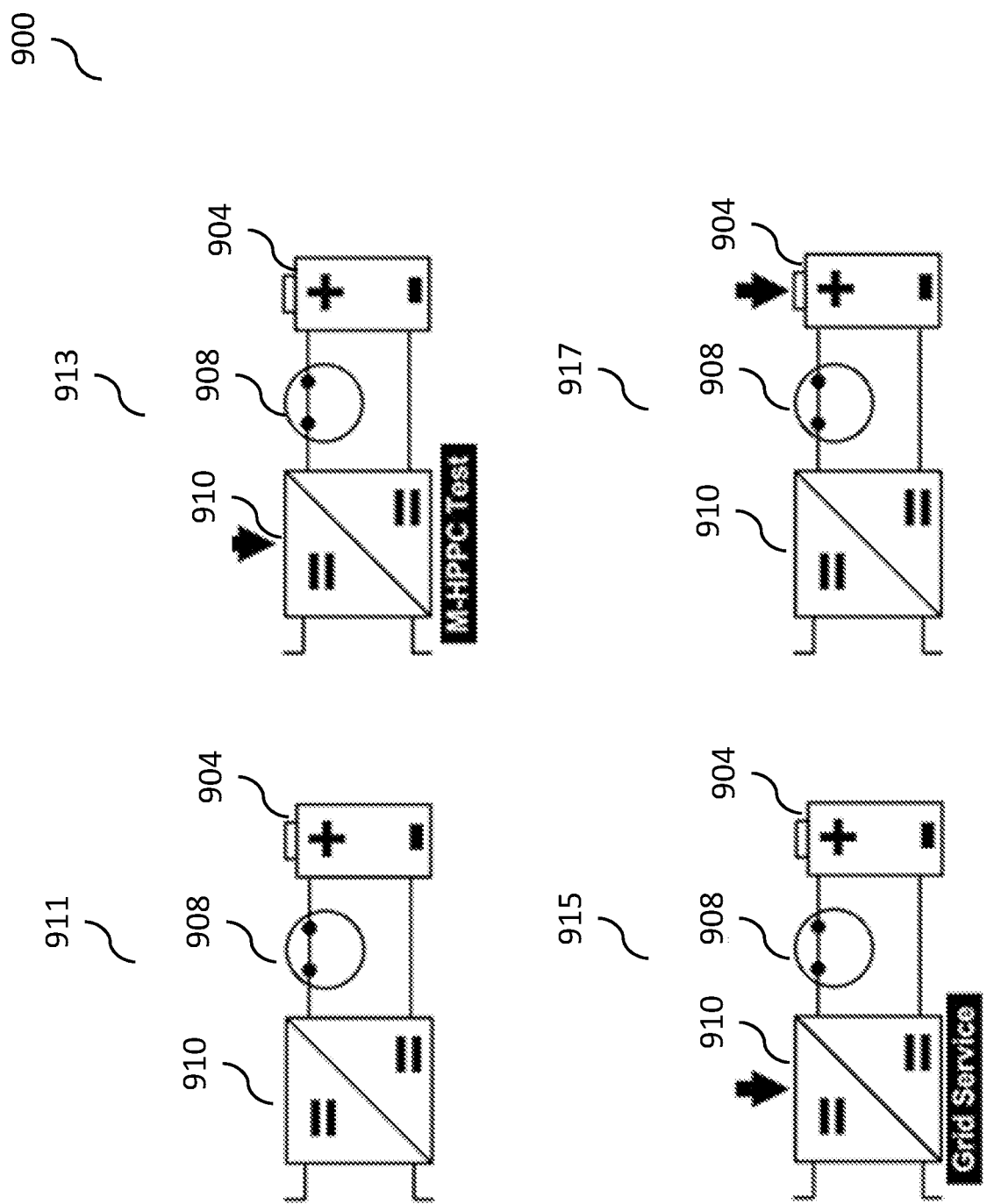
FIGS. 9a-9b illustrate an exemplary process for executing performance characterization of batteries (e.g., battery cells, units, bricks, groups, etc.) that may be performed by a controller of system shown in FIG. 7, according to some implementations of the current subject matter.
Figure 9B:
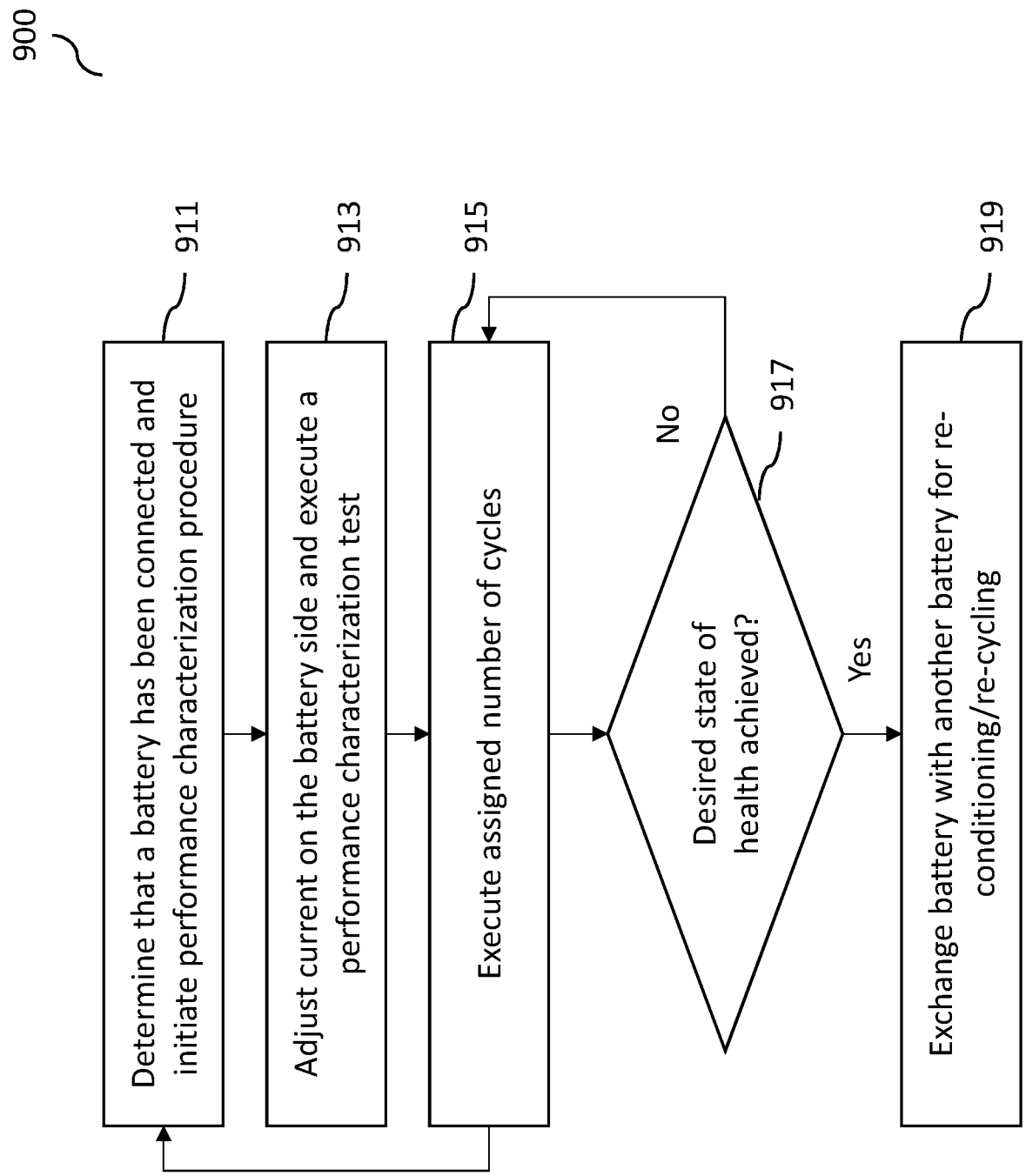

Once the re-conditioned/re-cycled batteries (e.g., battery cell(s), unit(s), brick(s), group(s), etc.) are exchanged or swapped with new batteries (e.g., battery cell(s), unit(s), brick(s), group(s), etc.) that are yet to be re-conditioned/re-cycled, the controller 701 may be configured to execute one or more diagnostics procedures (e.g., performance characterization, etc.) on the swapped batteries. FIGS. 9a-9b illustrate a process 900 for executing performance characterization of batteries (e.g., battery cells, units, bricks, groups, etc.) that may be performed by the controller 701, according to some implementations of the current subject matter. FIG. 9a illustrates an exemplary block diagram corresponding to the process 900 and FIG. 9b illustrates an exemplary flow diagram, corresponding to the block diagram of FIG. 9a, of the process 900.

At 911, the controller 701 may be configured determine whether a battery (e.g., battery cell(s), unit(s), brick(s), group(s), etc.) 904 has been connected to the relay 908 and, hence, the paired converter 910. The battery may be a newly-swapped battery that needs re-conditioning/re-cycling.

At 913, the controller 701 may be configured to adjust/control current on the battery 904's side of the converter 910 and execute a performance characterization test. The test may include a modified high pulse power characterization (M-HPPC) test of the battery. As can be understood, other battery testing procedures may be implemented.

The high pulse power characterization profile test routine may be used to quantify battery capacity and efficiency. It involves applying both charging and discharging pulses 1002 on a testing battery, as shown in FIG. 10a. In some implementations, when a battery is connected in the system 700, it may be configured to independently apply custom power as long as the polarity is in line with the rest of the batteries 704 on a string. The current subject matter's modified high-power pulse characterization test (M-HPPC) may be configured to only execute the charging part 1004 when the system 700 is in a charging cycle, and only execute the discharging part 1006 then the overall system is in discharging cycle, as shown in FIG. 10b.

The controller 701 may be configured to compensate any differences between the M-HPPC profile on the single battery 904 and a cycle profile of the entire string of batteries (e.g., strings of batteries 704 (other than the battery being tested) shown in FIG. 7) by adjusting other converters' (e.g., converters 710 (other than the converter connected to the battery being tested) shown in FIG. 7) output on the same string. Once the test completes, the controller 701 may be configured to determine the current state of health of the attached battery 904 (e.g., 60%, 70%, etc. of the original battery capacity). The controller 701 may also determine a desired target state of health value after the battery re-conditioning/re-cycling is performed (e.g., 80% of the original capacity).

At 915, the controller 701, based on the determined target state of health value, may assign a predetermined number of cycles to the battery 904. In some implementations, the controller may use battery 904's current state of health, characteristics of the battery (e.g., chemical composition of the battery, type of battery, etc.), historical cycling data relating to the type of battery being reconditioned, etc. and any combination thereof to determine the number of cycles that may need to be performed to achieve the determined target state of health value for the battery 904. Alternatively, or in addition to, the controller 701 may be configured to use a battery aging model generated based on prior cycling data analysis to determine the number of cycles for a particular battery.

Once the number of cycles has been assigned to the battery 904, the controller 701 may execute a cycling process of the battery 904 in accordance with the assigned cycles number, at 915. Upon completion of the assigned number of cycles, the controller 701 may be configured to repeat operations 911-913, discussed above, to test the battery.

At 917, the controller 701 may determine whether the desired target state of health value has been achieved. If it has been achieved, the controller 701 may generate an appropriate indication and initiate a battery exchange/swap process 800 shown in FIGS. 8*a-b*, at 919. Otherwise, if the desired target state of health value has not been achieved, at 917, the controller 701 may return the process 900 to repeat the number of cycles determined at 915. As a result of executing the process 900, the controller 701 may be configured to update the battery aging model to fine tune the process of determining and assigning the number of cycles to batteries.

Referring back to FIG. 7, in some implementations, the system 700 may be configured to operate in one or more of the following modes with respect to one or more battery branches 705 (as may be defined by converter 710, relay 708, and battery 704). The modes may include exchanging/swapping, testing and cycling. During each mode, the system 700 may be configured to demand a particular total amount of power (PG) from the grid 702 at a point. The controller 701 may be configured to determine such total power demand (PG) based on individual power demands (Pk) by each branch 705. The individual power demands may be based on specific modes that each branch 705 may operating in.

For example, in the exchanging/swapping mode, the $k^{th}$ battery that is being exchanged/swapped does not demand any power (i.e., $P_k=0$), and, hence, the total power demand (PG) may be determined using the remaining battery branches 705 as follows:

$$PG = P_1 + \ldots + P_{k-1} + P_{k+1} + \ldots + P_n$$

In the testing mode, the total power demand may be determined based on the current profile ($I_k$) of the battery being tested, as determined by the controller 701 in accordance with the M-HPPC test being performed. The power demand of the kth battery being tested may be determined as follows:

$$P_k = V_k * I_k$$

Hence, the power demand may be determined as follows:

$$PG - P_k = P_1 + \ldots + P_{k-1} + P_{k+1} + \ldots + P_n$$

In the cycling mode or normal operation the total power demand may be determined based on the individual amounts of power demanded by each branch:

$$PG = P_1 + P_2 + P_3 + \ldots + P_n$$

Each individual's battery power $P_i$ (i=1, 2, ..., n) may be limited to a predetermined state of health value (e.g., 80%, etc.) of the rated battery power.

Figure 11:
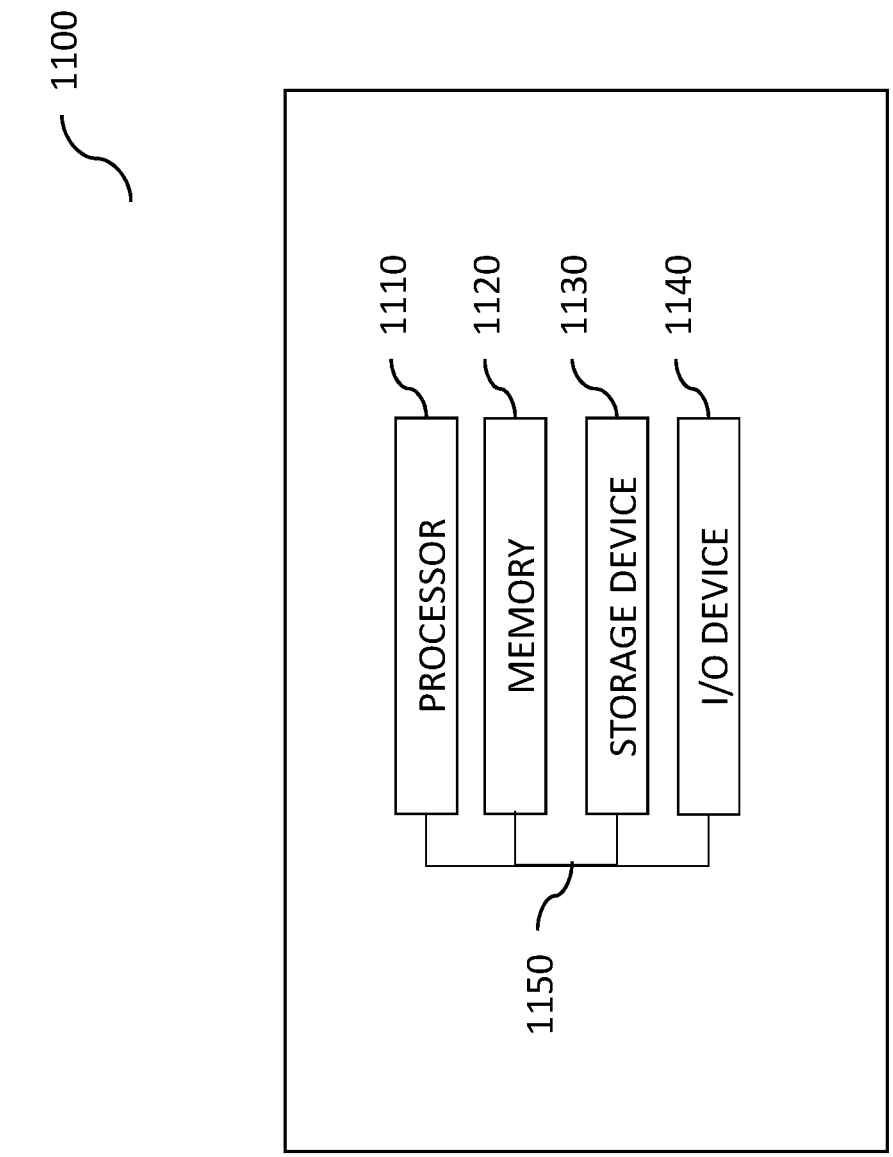
FIG. 11 illustrates an exemplary system, according to some implementations of the current subject matter.

In some implementations, the current subject matter can be configured to be implemented in a system 1100, as shown in FIG. 11. The system 1100 can include a processor 1110, a memory 1120, a storage device 1130, and an input/output device 1140. Each of the components 1110, 1120, 1130 and 1140 can be interconnected using a system bus 1150. The processor 1110 can be configured to process instructions for execution within the system 1100. In some implementations, the processor 1110 can be a single-threaded processor. In alternate implementations, the processor 1110 can be a multi-threaded processor. The processor 1110 can be further configured to process instructions stored in the memory 1120 or on the storage device 1130, including receiving or sending information through the input/output device 1140. The memory 1120 can store information within the system 1100. In some implementations, the memory 1120 can be a computer-readable medium. In alternate implementations, the memory 1120 can be a volatile memory unit. In yet some implementations, the memory 1120 can be a non-volatile memory unit. The storage device 1130 can be capable of providing mass storage for the system 1100. In some implementations, the storage device 1130 can be a computer-readable medium. In alternate implementations, the storage device 1130 can be a floppy disk device, a hard disk device, an optical disk device, a tape device, non-volatile solid state memory, or any other type of storage device. The input/output device 1140 can be configured to provide input/output operations for the system 1100. In some implementations, the input/output device 1140 can include a keyboard and/or pointing device. In alternate implementations, the input/output device 1140 can include a display unit for displaying graphical user interfaces.

Figure 12:
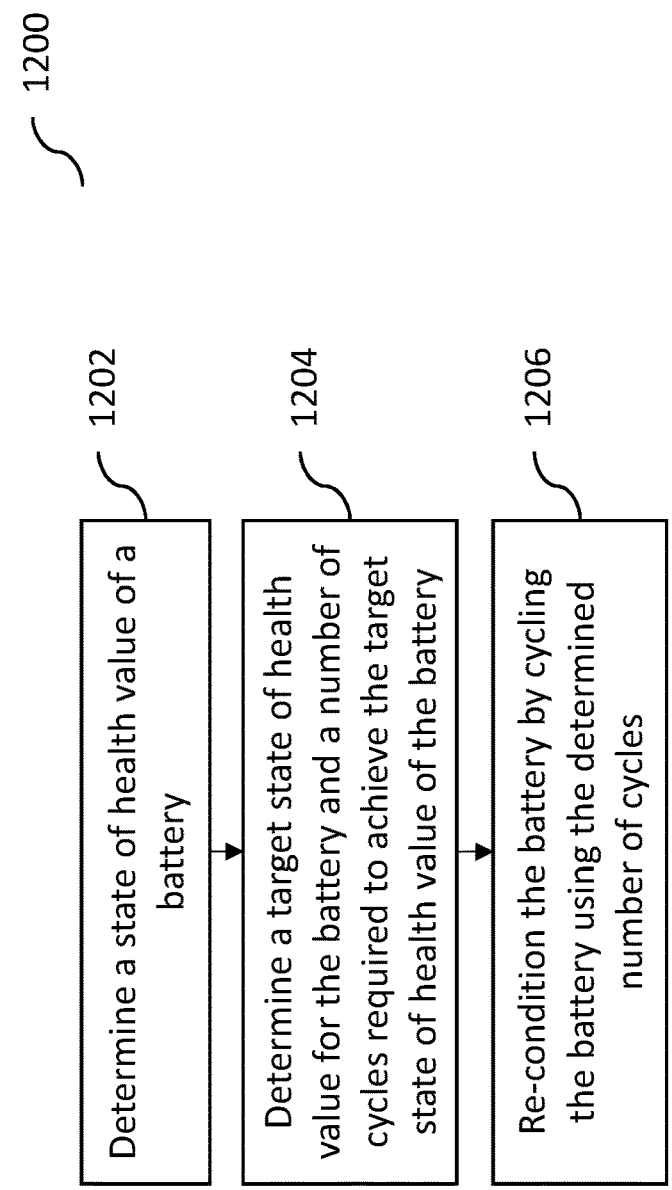
FIG. 12 illustrates an exemplary method, according to some implementations of the current subject matter.

FIG. 12 illustrates an exemplary method 1200 for re-conditioning/re-cycling batteries for second-use applications, according to some implementations of the current subject matter. The method 1200 may be executed by the controller 701 of the system 700 shown in FIG. 7. At 1202, the controller 701 may be configured to determine a state of health value of a battery. The state of health value of the battery may be less than an original capacity value of the battery. This may mean that the battery has been through its first use application (e.g., as shown in FIG. 5). The battery may be connected to an electrical power source (e.g., grid 702 shown in FIG. 7) for re-conditioning. To determine state of health of the battery, the controller may be configured to perform process 900 shown in FIGS. 9*a-b*.

At 1204, the controller 701 may be configured to determine a target state of health value for the battery (e.g., 70%, 80%, etc. of the original capacity). Moreover, the controller may be configured to determine a number of cycles that may be required to achieve the target state of health value of the battery. Each cycle in the number of cycles may include at least one of: a charging of the battery and a discharging of the battery. The target state of health value may be determined in accordance with its second-life application. The number of cycles may be determined by the controller 701 using process 900 shown in FIGS. 9*a-b* (e.g., operation 915).

At 1204, the controller 701 may be configured to execute re-conditioning of the battery by cycling the battery using the determined number of cycles. Cycling may include drawing electrical power from the electrical power source (e.g., grid 702 shown in FIG. 7).

In some implementations, the current subject matter may include one or more of the following optional features. The battery includes at least one of the following: a battery cell, a battery unit, a battery system, a battery brick, a battery brick group, and any combination thereof.

In some implementations, the target state of health value for the battery may be determined using a battery aging model generated based on one or more prior re-conditionings of a plurality of batteries.

In some implementations, the re-conditioning may include determining a re-conditioned state of health value of a battery after performing the re-conditioning. Further, the method 1200 may include comparing the re-conditioned state of health value to the determined target state of health value of the battery, repeating the re-conditioning of the battery upon determining that the re-conditioned state of health value does not equal to the determined target state of health value of the battery, and disconnecting the battery from the electrical power source upon determining that the re-conditioned state of health value equals to the determined target state of health value of the battery. Additionally, the method 1200 may include connecting another battery to the electrical power source for re-conditioning after disconnecting the battery (e.g., as shown in FIGS. 8*a-b*), and repeating the determining a state of health value, determining a target state of health value and a number of cycles, and the re-conditioning for the another battery.

In some implementations, a plurality of batteries may be connected to the electrical power source for re-conditioning, each battery in the plurality of batteries is individually connected to the power source using corresponding converter and a relay component. An amount of electrical power demand for the plurality of batteries may be determined based on an individual amount of power demanded by each battery in the plurality of batteries for at least one of the determining the state of health value for the battery, the re-conditioning of the battery, and any combination thereof.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A method, comprising:
   determining a state-of-health value of a battery used for a primary application, wherein the state-of-health value of the battery is less than an original capacity value of the battery, the battery being connected to an electrical power source for re-conditioning;
   determining a target state-of-health value for the battery and a number of cycles required to achieve the target state-of-health value of the battery, each cycle in the number of cycles comprises at least one of: a charging the battery and a discharging the battery; and
   re-conditioning the battery by cycling the battery using the number of cycles, wherein cycling comprises drawing electrical power from the electrical power source until a re-conditioned state-of-health value of the battery corresponding to a secondary application is reached.

2. The method according to claim 1, wherein the battery comprises at least one of: a battery cell, a battery unit, a battery system, a battery brick, a battery brick group, and any combination thereof.

3. The method according to claim 1, wherein the target state-of-health value for the battery is determined using a battery aging model generated based on one or more prior re-conditionings of a plurality of batteries.

4. The method according to claim 1, wherein the re-conditioning comprises determining the re-conditioned state-of-health value of a battery after performing the re-conditioning.

5. The method according to claim 4, further comprising
   comparing the re-conditioned state-of-health value to the target state-of-health value of the battery;
   repeating the re-conditioning of the battery upon determining that the re-conditioned state-of-health value does not equal to the target state-of-health value of the battery; and
   disconnecting the battery from the electrical power source upon determining that the re-conditioned state-of-health value equals to the determined target state-of-health value of the battery.

6. The method according to claim 5, further comprising
   connecting another battery to the electrical power source for re-conditioning after disconnecting the battery; and
   repeating the determining a state-of-health value, determining a target state-of-health value and a number of cycles, and the re-conditioning for the another battery.

7. The method according to claim 1, wherein a plurality of batteries are connected to the electrical power source for re-conditioning, each battery in the plurality of batteries is individually connected to the electrical power source using a corresponding converter and a relay component.

8. The method according to claim 7, wherein an amount of electrical power demand for the plurality of batteries is determined based on an individual amount of power demanded by each battery in the plurality of batteries for at least one of the determining the state-of-health value for the battery, the re-conditioning of the battery, and any combination thereof.

9. The method of claim 1, wherein the primary application comprises a first operation within an electric vehicle and the secondary application comprises a second operation within any of household appliances, buildings, and electrical grids.

10. A system comprising:
    at least one programmable processor; and
    a non-transitory machine-readable medium storing instructions that, when executed by the at least one programmable processor, cause the at least one programmable processor to perform operations comprising:
    determining a state-of-health value of a battery used for a primary application, wherein the state-of-health value of the battery is less than an original capacity value of the battery, the battery being connected to an electrical power source for re-conditioning;
    determining a target state-of-health value for the battery and a number of cycles required to achieve the target state-of-health value of the battery, each cycle in the number of cycles comprises at least one of: a charging the battery and a discharging the battery; and
    re-conditioning the battery by cycling the battery using the number of cycles, wherein cycling comprises drawing electrical power from the electrical power source until a re-conditioned state-of-health value of the battery corresponding to a secondary application is reached.

11. The system according to claim 10, wherein the battery comprises at least one of: a battery cell, a battery unit, a battery system, a battery brick, a battery brick group, and any combination thereof.

12. The system according to claim 10, wherein the target state-of-health value for the battery is determined using a battery aging model generated based on one or more prior re-conditionings of a plurality of batteries.

13. The system according to claim 10, wherein the re-conditioning comprises determining the re-conditioned state-of-health value of a battery after performing the re-conditioning.

14. The system according to claim 13, wherein the operations further comprise
    comparing the re-conditioned state-of-health value to the target state-of-health value of the battery;
    repeating the re-conditioning of the battery upon determining that the re-conditioned state-of-health value does not equal to the target state-of-health value of the battery; and
    disconnecting the battery from the electrical power source upon determining that the re-conditioned state-of-health value equals to the target state-of-health value of the battery.

15. The system according to claim 14, wherein the operations further comprise
    connecting another battery to the electrical power source for re-conditioning after disconnecting the battery; and
    repeating the determining a state-of-health value, determining a target state-of-health value and a number of cycles, and the re-conditioning for the another battery.

16. The system according to claim 10, wherein a plurality of batteries are connected to the electrical power source for re-conditioning, each battery in the plurality of batteries is individually connected to the electrical power source using a corresponding converter and a relay component.

17. The system according to claim 16, wherein an amount of electrical power demand for the plurality of batteries is determined based on an individual amount of power demanded by each battery in the plurality of batteries for at least one of the determining the state-of-health value for the battery, the re-conditioning of the battery, and any combination thereof.

18. A computer program product comprising a non-transitory machine-readable medium storing instructions that, when executed by at least one programmable processor, cause the at least one programmable processor to perform operations comprising:
determining a state-of-health value of a battery used for a primary application, wherein the state-of-health value of the battery is less than an original capacity value of the battery, the battery being connected to an electrical power source for re-conditioning;
determining a target state-of-health value for the battery and a number of cycles required to achieve the target state-of-health value of the battery, each cycle in the number of cycles comprises at least one of: a charging the battery and a discharging the battery; and
re-conditioning the battery by cycling the battery using the number of cycles, wherein cycling comprises drawing electrical power from the electrical power source until a re-conditioned state-of-health value of the battery corresponding to a secondary application is reached.

19. The computer program product according to claim 18, wherein the battery comprises at least one of: a battery cell, a battery unit, a battery system, a battery brick, a battery brick group, and any combination thereof.

20. The computer program product according to claim 18, wherein the target state-of-health value for the battery is determined using a battery aging model generated based on one or more prior re-conditionings of a plurality of batteries; wherein the re-conditioning comprises determining the re-conditioned state-of-health value of a battery after performing the re-conditioning.

21. The computer program product according to claim 17, wherein the operations further comprise
comparing the re-conditioned state-of-health value to the target state-of-health value of the battery;
repeating the re-conditioning of the battery upon determining that the re-conditioned state-of-health value does not equal to the target state-of-health value of the battery;
disconnecting the battery from the electrical power source upon determining that the re-conditioned state-of-health value equals to the target state-of-health value of the battery;
connecting another battery to the electrical power source for re-conditioning after disconnecting the battery; and
repeating the determining a state-of-health value, determining a target state-of-health value and a number of cycles, and the re-conditioning for the another battery.

22. The computer program product according to claim 18, wherein a plurality of batteries are connected to the electrical power source for re-conditioning, each battery in the plurality of batteries is individually connected to the electrical power source using a corresponding converter and a relay component;
wherein an amount of electrical power demand for the plurality of batteries is determined based on an individual amount of power demanded by each battery in the plurality of batteries for at least one of the determining the state-of-health value for the battery, the re-conditioning of the battery, and any combination thereof.

* * * * *